US011128401B2

(12) United States Patent
Ma et al.

(10) Patent No.: US 11,128,401 B2
(45) Date of Patent: Sep. 21, 2021

(54) METHOD AND APPARATUS FOR PROCESSING INFORMATION, COMMUNICATIONS DEVICE, AND COMMUNICATIONS SYSTEM

(71) Applicant: HUAWEI TECHNOLOGIES CO., LTD., Guangdong (CN)

(72) Inventors: Liang Ma, Shanghai (CN); Xin Zeng, Shenzhen (CN); Yuejun Wei, Shanghai (CN); Carmela Cozzo, San Diego, CA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/529,438

(22) Filed: Aug. 1, 2019

(65) Prior Publication Data

US 2019/0356333 A1 Nov. 21, 2019

Related U.S. Application Data

(63) Continuation of application No. PCT/CN2018/074574, filed on Jan. 30, 2018.

(30) Foreign Application Priority Data

Feb. 4, 2017 (CN) .................. 201710064621.X

(51) Int. Cl.
*H04L 1/00* (2006.01)
*H03M 13/00* (2006.01)
*H03M 13/11* (2006.01)

(52) U.S. Cl.
CPC ........... *H04L 1/0067* (2013.01); *H03M 13/11* (2013.01); *H03M 13/616* (2013.01);
(Continued)

(58) Field of Classification Search
CPC .. H04L 1/0067; H04L 1/0013; H03M 13/635; H03M 13/6393
See application file for complete search history.

(56) References Cited

U.S. PATENT DOCUMENTS 9,071,402 B2 6/2015 Cheng
10,425,191 B2 * 9/2019 Ma ...................... H04L 1/0045
(Continued)

FOREIGN PATENT DOCUMENTS

CN 101005334 A 7/2007
CN 101188428 A 5/2008
(Continued)

OTHER PUBLICATIONS

Intel Corporation,"LDPC HARQ design",3GPP TSG RAN WG1 Ad hoc R1-1700384,Spokane, USA, Jan. 16-20, 2017, 2 pages.
(Continued)

*Primary Examiner* — Joseph D Torres
(74) *Attorney, Agent, or Firm* — Fish & Richardson P.C.

(57) ABSTRACT

This application discloses a method and an apparatus for processing information, a communications device, and a communications system. The communications device is configured to obtain a starting position of an output bit sequence in a coded block in a circular buffer, and determine the output bit sequence in the coded block based on a length of the output bit sequence and the starting position. A value of the starting position is one of $\{p_0, p_1, p_2, \ldots, p_{k_{max}-1}\}$, where $0 \leq p_k < N_{CB}$, $P_k$ is an integer, k is an integer, $0 \leq k < k_{max}$, $N_{CB}$ is a size of the coded block, and $k_{max}$ is an integer greater than or equal to 4.

14 Claims, 7 Drawing Sheets

(52) U.S. Cl.
CPC ..... *H03M 13/635* (2013.01); *H03M 13/6393* (2013.01); *H04L 1/0013* (2013.01)

(56) References Cited

U.S. PATENT DOCUMENTS

| | | | |
|---|---|---|---|
| 2002/0114401 A1* | 8/2002 | Kim | H03M 13/6306 375/262 |
| 2004/0054959 A1* | 3/2004 | Blankenship | H03M 13/09 714/800 |
| 2008/0320353 A1* | 12/2008 | Blankenship | H04L 1/1819 714/746 |
| 2009/0204868 A1 | 8/2009 | Park et al. | |
| 2009/0249157 A1 | 10/2009 | Lee et al. | |
| 2010/0122138 A1 | 5/2010 | Nishio et al. | |
| 2010/0281329 A1 | 11/2010 | Yokokawa et al. | |
| 2013/0343271 A1 | 12/2013 | El-Khamy et al. | |
| 2019/0013901 A1* | 1/2019 | Nimbalker | H04L 1/0067 |

FOREIGN PATENT DOCUMENTS

| | | |
|---|---|---|
| CN | 103312442 A | 9/2013 |
| JP | 2010529756 A | 8/2010 |
| RU | 2547696 C2 | 4/2015 |
| WO | 2008124966 A1 | 10/2008 |

OTHER PUBLICATIONS

Intel Corporation, "Finalization of remaining details of rate-matching", 3GPP TSG RAN WG1 Meeting NR #3 R1-1716329, Nagoya, Japan, Sep. 18-21, 2017, 6 pages.

Extended European Search Report issued in European Application No. 18748392.0 dated Nov. 19, 2019, 9 pages.

R1-1700248—Zte et al., "Bit rearrangement of LDPC for high order modulation," 3GPP TSG RAN WG1 AH_NR Meeting, Spokane, USA, Jan. 16-20, 2017, 5 pages.

Gallager, "Low-density parity-check codes," IRE Transactions on Information Theory, 1962, pp. 21-28.

PCT International Search Report and Written Opinion issued in International Application No. PCT/CN2018/074574 dated May 10, 2018, 19 pages (with English translation).

Office Action issued in Japanese Application No. 2019-542221 dated Nov. 2, 2020, 9 pages (with English translation).

Office Action issued in Russian Application No. 2019127742/07(054477) dated Feb. 16, 2021, 24 pages (machine translation).

MediaTek Inc., "Discussion on LDPC coding scheme of code structure, granularity and HARQ-IR," 3GPP TSG-RAN WG1 #86, R1-167532, Gothenburg, Sweden, Aug. 22-26, 2016, 10 pages.

Office Action issued in Chinese Application No. 202010826972.1 dated May 27, 2021, 10 pages (with English translation).

* cited by examiner

FIG. 1

METHOD AND APPARATUS FOR PROCESSING INFORMATION, COMMUNICATIONS DEVICE, AND COMMUNICATIONS SYSTEM

CROSS-REFERENCE TO RELATED APPLICATIONS

This application is a continuation of International Application No. PCT/CN2018/074574, filed on Jan. 30, 2018, which claims priority to Chinese Patent Application No. 201710064621.X, filed on Feb. 4, 2017. The disclosures of the aforementioned applications are hereby incorporated by reference in their entireties.

TECHNICAL FIELD

Embodiments of the present invention relate to the communications field, and in particular, to a method and an apparatus for processing information, a communications device, and a communications system.

BACKGROUND

In a wireless communications system, a hybrid automatic repeat request (HARQ) technology is an important technology that can well improve reliability of a data link.

A low-density parity-check (LDPC) code is a type of linear block code having a sparse check matrix, and is characterized by a flexible structure and a low decoding complexity. Because the LDPC code uses a partially-parallel iteration decoding algorithm, the LDPC code has a higher throughput than a conventional turbo code. The LDPC code may be used as a next-generation error-correcting code for communications systems and can be used to improve channel transmission reliability and power utilization; and can be widely applied to space communications, fiber optic communications, personal communications systems, ADSLs, magnetic recording devices, and the like. Currently, in $5^{th}$ generation mobile communications, LDPC code scheme has been considered as one of channel coding schemes.

To support various code lengths and code rates, a communications device performs rate matching after channel coding to adjust a code rate of a coded block, and obtains a bit sequence that needs to be sent, so as to match a decoding code rate. During the rate matching, the communications device may further perform bit puncturing on LDPC coded blocks generated after the coding, to increase the code rate; or perform bit repetition on the LDPC coded blocks generated after the coding, to decrease the code rate.

In the rate matching process, a communications device at a transmit end selects a bit sequence that needs to be sent, performs processing such as interleaving and mapping on the bit sequence, and sends the processed bit sequence to a communications device at a receive end. The communications device at the receive end performs combining and decoding on soft values of the bit sequence and stored soft channel bits (soft channel bit) in decoding, to obtain a code block.

In the prior art, when the communications device at the transmit end uses an existing rate matching method, HARQ performance is relatively poor.

SUMMARY

Embodiments of the present invention provide a method and an apparatus for processing information, a communications device, and a communications system, to improve HARQ performance.

According to a first aspect, a method for processing information in a communications system is provided. The method includes:

obtaining a starting position $k_0(i)$ of an output bit sequence in a coded block; and determining the output bit sequence in the coded block based on a length $E(i)$ of the output bit sequence and the starting position $k_0(i)$, where the coded block is stored in a circular buffer, and i is an integer greater than or equal to 0.

According to a second aspect, a method for processing information in a communications system is provided. The method includes:

obtaining a starting position $k_0(i)$ of a soft bit sequence having a length of $E(i)$ stored in a soft buffer; and combining and storing the soft bit sequence in the soft buffer starting from the starting position $k_0(i)$.

In a possible implementation of the first aspect or the second aspect, for a retransmission, to be specific, for i>0, $k_0(i)$ is determined based on a starting position $k_0(i-1)$ of a previous transmission output bit sequence and a length $E(i-1)$ of the previous transmission output bit sequence. $k_0(i)=(k_0(i-1)+F(i-1))\bmod N_{CB}$. $N_{CB}$ is a size of the coded block, and $F(i-1)$ is a bit quantity required for sequentially obtaining $E(i-1)$ output bits from the coded block starting from $k_0(i-1)$.

In this implementation, output bit sequences of two adjacent transmissions are consecutive, and no repeated bit exists between the two output bit sequences, so that when such output bit sequences are sent to a communications device at a receive end, relatively good decoding performance can be achieved.

In a possible implementation based on the foregoing implementation, if a bit at the end position in the coded block is transmitted, $k_0(i)=(k_0(i-1)+F(i-1)+E_{offset})\bmod N_{CB}$; otherwise, $k_0(i)=(k_0(i-1)+F(i-1))\bmod N_{CB}$.

In this implementation, after all bits are transmitted, a quantity of repeated bits is reduced, thereby reducing a decoding performance loss.

In another possible implementation of the first aspect or the second aspect, a value of $k_0(i)$ is $p_k$, $p_k$ is one of $\{p_0, p_1, p_2 \ldots, p_{k_{max}-1}\}$, $0 \le p_k < N_{CB}$, $p_k$ is an integer, k is an integer, $0 \le k < k_{max}$, $N_{CB}$ is a size of the coded block, and $k_{max}$ is an integer greater than or equal to 4.

For example, $k_{max}=2^n$, and n is an integer greater than or equal to 2; or $k_{max}=Nb$, and Nb is a quantity of columns of a base matrix.

In another possible implementation based on the first aspect or the second aspect or the foregoing implementation, if k=0, $p_0=l \cdot z$, where l is an integer, and $0>l<Nb$; or if $0<k<k_{max}$, $p_k=(p_{k-1}+S)\bmod N_{CB}$. S is an integer. For example, $$S = \left\lfloor \frac{N_{CB}}{k_{max}} \right\rfloor, \text{ or } S = \left\lceil \frac{N_{CB}}{k_{max}} \right\rceil,$$

or S=z, where z is a lifting size of the coded block. $\lceil \ \rceil$ represents rounding up to an interger, and $\lfloor \ \rfloor$ represents rounding down to an interger.

By using $$S = \left\lfloor \frac{N_{CB}}{k_{max}} \right\rfloor \text{ or } S = \left\lceil \frac{N_{CB}}{k_{max}} \right\rceil$$

as an example, $p_k$ satisfies $$p_k = \left(p_{k-1} + \left\lfloor \frac{N_{CB}}{k_{max}} \right\rfloor\right) \bmod N_{CB} \text{ or}$$

$$p_k = \left(p_{k-1} + \left\lceil \frac{N_{CB}}{k_{max}} \right\rceil\right) \bmod N_{CB}.$$

For another example, $p_k$ satisfies $$p_k = \left(p_0 + \left\lfloor \frac{N_{CB} \cdot k}{k_{max}} \right\rfloor\right) \bmod N_{CB},$$

$$p_k = \left(p_0 + \left\lceil \frac{N_{CB} \cdot k}{k_{max}} \right\rceil\right) \bmod N_{CB},$$

$$p_k = \left(p_0 + k \cdot \left\lfloor \frac{N_{CB}}{k_{max}} \right\rfloor\right) \bmod N_{CB}, \text{ or}$$

$$p_k = \left(p_0 + k \cdot \left\lceil \frac{N_{CB}}{k_{max}} \right\rceil\right) \bmod N_{CB}.$$

In an example in which S=z and z is the lifting size of the coded block, $p_k$=(k·z)mod $N_{CB}$. In this implementation, a value of $k_{max}$ may be Nb, and Nb is the quantity of columns of the base matrix.

The foregoing method can adapt to various initial transmission code rates, so that an interval between redundancy version transmissions does not vary greatly or does not include a large quantity of repeated bits, thereby achieving relatively stable performance.

In another possible implementation of the first aspect or the second aspect, a value of $k_0(i)$ is $p_k$, $p_k$ is one of $\{p_0, p_1, p_2 \ldots, p_{k_{max}-1}\}$, $0 \le p_k < N_{CB}$, $p_k$ is an integer, k is an integer, $0 \le k < k_{max}$, $N_{CB}$ is a size of the coded block, and $k_{max}$ is an integer greater than or equal to 4.

For example, $k_{max}=2^n$, and n is an integer greater than or equal to 2; or $k_{max}$=Nb, and Nb is a quantity of columns of a base matrix.

If $p_k$>(Nb−Mb+j)*z, $p_k$ satisfies $p_k-p_{k-1} \le p_{k+1}-p_k$, where $p_{m+1}$=(Nb−Mb+j)*z, 0<m+1<k<$k_{max}$−1, j is a quantity of parity bits corresponding to weight-2 columns in the coded block or j is a quantity of parity bits that correspond to weight-2 columns and that are not punctured in the coded block, and z is a lifting size of the coded block.

If $p_k$<(Nb−Mb+j)*z, $p_k$ satisfies $$p_k = \left(p_0 \left\lfloor \frac{(p_{m+1} - p_0) \cdot k}{m+1} \right\rfloor\right) \bmod p_{m+1}$$

or $$p_k = \left(p_0 + \left\lceil \frac{(p_{m+1} - p_0) \cdot k}{m+1} \right\rceil\right) \bmod p_{m+1},$$

where $p_{m+1}$=(Nb−Mb+j)*z, 0<k<m+1, j is the quantity of parity bits corresponding to weight-2 columns in the coded block or j is the quantity of parity bits that correspond to weight-2 columns and that are not punctured from the coded block, and z is the lifting size of the coded block.

According to the method, starting positions are more densely distributed at positions closer to information bits, and starting positions are more sparsely distributed at positions closer to the last bit of the coded block.

In the foregoing implementations, kmax may be an integer greater than 4. For example, $k_{max}$=5; or $k_{max}=2^n$, and $k_{max}$ is 8 or above, for example, 8 or 16, where n is an integer greater than 2. For another example, $k_{max}$=Nb, and Nb is the quantity of columns of the base matrix of the coded block. An increase in $k_{max}$ can reduce a distance between starting positions of redundancy versions. The redundancy version determined based on the starting position can also improve decoding performance of the communications device at the receive end.

In another possible implementation based on any one of the foregoing implementations, for the retransmission, to be specific, for i>0, the starting position $k_0(i)$ is determined based on the starting position $k_0(i-1)$ of the previous transmission output bit sequence and the length E(i−1) of the previous transmission output bit sequence.

In a possible implementation, to reduce a quantity of repeated redundancy bits, $p_k$ is a minimum value satisfying $p_k \ge ((k_0(i-1)+F(i-1)) \bmod N_{CB})$; or if $((k_0(i-1)+F(i-1)) \bmod N_{CB})$ is greater than a largest value in $\{p_0, p_1, p_2 \ldots, p_{k_{max}-1}\}$, $p_k$ is a smallest value in $\{p_0, p_1, p_2 \ldots, p_{k_{max}-1}\}$.

In another possible implementation, to meet a sequential decoding requirement, $p_k$ is a maximum value satisfying $p_k \le ((k_0(i-1)+F(i-1)) \bmod N_{CB})$; or if $((k_0(i-1)+F(i-1)) \bmod N_{CB})$ is less than a smallest value in $\{p_0, p_1, p_2 \ldots, p_{k_{max}-1}\}$, $p_k$ is a largest value in $\{p_0, p_1, p_2, p_{k_{max}-1}\}$.

In another possible implementation, to compensate decoding performance losses caused by repeating bits and by skipping redundancy bits, if $p_0 \le ((k_0(i-1)+F(i-1)) \bmod N_{CB}) \le p_{k_{max}-1}$, $p_k$ is a value in $\{p_0, p_1, p_2 \ldots, p_{k_{max}-1}\}$ that has a smallest difference with $((k_0(i-1)+F(i-1)) \bmod N_{CB})$; or if $((k_0(i-1)+F(i-1)) \bmod N_{CB})$ is less than a smallest value in $\{p_0, p_1, p_2 \ldots, p_{k_{max}-1}\}$ or $((k_0(i-1)+F(i-1)) \bmod N_{CB})$ is greater a largest value in $\{p_0, p_1, p_2 \ldots, p_{k_{max}-1}\}$, $p_k$ is one of the smallest value in $\{p_0, p_1, p_2 \ldots, p_{k_{max}-1}\}$ and the largest value $p_{k_{max}-1}$ in $\{p_0, p_1, p_2 \ldots, p_{k_{max}-1}\}$ that has a smaller difference with $((k_0(i-1)+F(i-1)) \bmod N_{CB})$.

In another possible implementation, to compensate decoding performance losses caused by repeating bits and by skipping redundancy bits, the starting position $k_0(i)$ is determined based on the starting position $k_0(i-1)$ of the previous transmission output bit sequence, the length E(i−1) of the previous transmission output bit sequence, and a quantity i of transmissions.

In the foregoing implementations, F(i−1) is a bit quantity required for sequentially obtaining E(i−1) output bits from the coded block starting from $k_0(i-1)$.

In another possible implementation based on any one of the foregoing implementations, the starting position $k_0(i)$ is determined based on a redundancy version starting position number $rv_{idx}(i)$.

For example, for an adaptive retransmission, the redundancy version number $rv_{idx}(i)$ may be obtained through signaling.

For another example, for an adaptive retransmission or a non-adaptive retransmission, the redundancy version starting position number $rv_{idx}$ may be obtained based on a sequence of redundancy version starting position numbers and a quantity i of transmissions.

The sequence of the redundancy version starting position numbers is retrieved from a memory, or the numbering sequence of the redundancy version starting positions is determined based on an initial transmission code rate, or the sequence of the redundancy version starting position numbers is determined based on the length of the output bit sequence and the lifting size z.

According to a third aspect, an apparatus for processing information in a communications system is provided. The apparatus includes:

an obtaining unit, configured to obtain a starting position $k_0(i)$ of an output bit sequence in a coded block; and a processing unit, configured to determine the output bit sequence in the coded block based on a length $E(i)$ of the output bit sequence and the starting position $k_0(i)$, where the coded block is stored in a circular buffer, and i is an integer greater than or equal to 0.

The apparatus may be configured to perform the method according to the first aspect or any possible implementation of the first aspect. For details, refer to the description of the foregoing aspect.

In a possible design, the apparatus for processing information according to this application may include a module correspondingly configured to perform the first aspect or any possible implementation of the first aspect in the foregoing method design. The module may be software and/or hardware.

According to a fourth aspect, an apparatus for processing information in a communications system is provided. The apparatus includes:

an obtaining unit, configured to obtain a starting position $k_0(i)$ of a soft bit sequence having a length of $E(i)$ stored in a soft buffer; and a processing unit, configured to combine and store the obtained soft bit sequence in the soft buffer starting from the starting position $k_0(i)$.

The apparatus may be configured to perform the method according to the second aspect or any possible implementation of the second aspect. For details, refer to the description of the foregoing aspect.

In a possible design, the apparatus for processing information according to this application may include a module correspondingly configured to perform the second aspect or any possible implementation of the second aspect in the foregoing method design. The module may be software and/or hardware.

According to a fifth aspect, a communications device is provided. The communications device includes an encoder, a rate matcher, and a transceiver.

The encoder is configured to encode information data.

The rate matcher includes the apparatus for processing information according to the third aspect, and is configured to determine the output bit sequence in the foregoing embodiments.

The transceiver is configured to send a signal corresponding to the output bit sequence from the rate matcher.

According to a sixth aspect, a communications device is provided. The communications device includes a decoder, a rate de-matcher, and a transceiver.

The transceiver is configured to receive a signal corresponding to the soft bit sequence of the output bit sequence in the foregoing aspect.

The decoder is configured to decode soft channel bits in a soft buffer.

The rate de-matcher includes the apparatus for processing information according to the fourth aspect, and is configured to combine and store the soft channel bits of the output bit sequence in the foregoing aspect in the soft buffer.

According to a seventh aspect, an embodiment of the present invention provides a communications system. The system includes the communications device according to the fifth aspect and the communications device according to the sixth aspect.

According to another aspect, an embodiment of the present invention provides a computer storage medium including a program designed to execute the foregoing aspects.

According to still another aspect of this application, a computer program product including instructions is provided. When the computer program product is run on a computer, cause the computer to perform the methods according to the foregoing aspects.

According to the method and apparatus for processing information, the communications device, and the communications system in the embodiments of the present invention, the output bit sequence for the initial transmission or the retransmission is properly determined, so that decoding performance of the communications device at the receive end after receiving the soft bit sequence of the output bit sequence is improved, a decoding success rate is improved, and a quantity of retransmissions is further reduced.

BRIEF DESCRIPTION OF DRAWINGS

FIG. 1 is a schematic diagram of a base matrix of an LDPC code and permutation matrices;

FIG. 5-1 is a schematic diagram of a coded block according to another embodiment of the present invention;

FIG. 5-2 is a schematic diagram of a coded block according to another embodiment of the present invention;

FIG. 5-3 is a schematic diagram of a coded block according to another embodiment of the present invention;

DESCRIPTION OF EMBODIMENTS

The following describes technical solutions in embodiments of the present invention with reference to the accompanying drawings in the embodiments of the present invention.

Figures 1, 5:
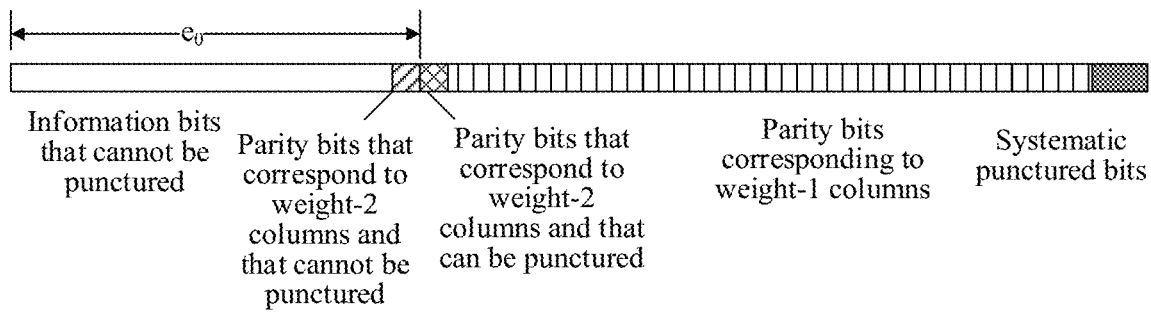
Figures 2, 5:
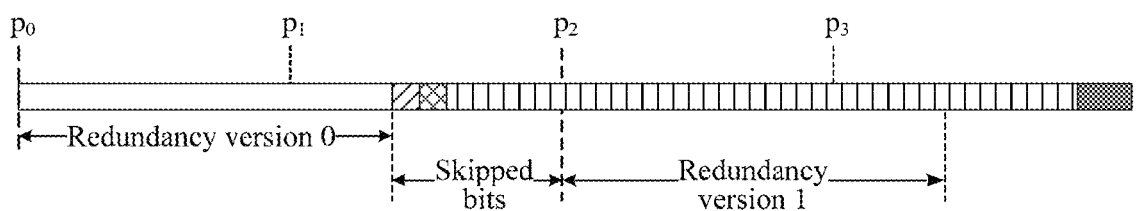
Figures 3, 5:
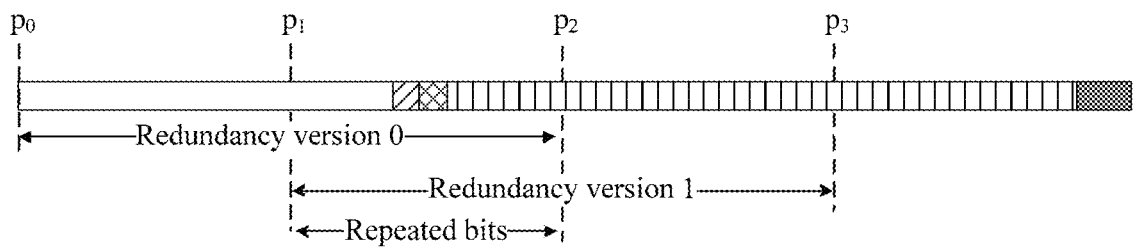

FIG. 1 is a schematic diagram of a base matrix of an LDPC code in a communications system and permutation matrices. The base matrix of the LDPC code includes $m_H*n_H$ elements, wherein $m_H$ is a row count of the base matrix, $n_H$ is a column count of the base matrix. If the base matrix is lifted by using z as a lifting size, an $(m_H z)*(n_H*z)$ parity check matrix H may be obtained. To be specific, the parity check matrix H includes $m_H*n_H$ blocks. Each block is obtained by performing cyclic shift on an identity matrix of size $z*z$. The lifting size z is usually determined based on a code block size supported by the system and an information data amount. FIG. 1 shows a base matrix, having a QC structure, of an LDPC code, where $m_H=13$, and $n_H=38$. A code rate of the base matrix is $(n_H-m_H)/n_H=0.6579$. If the lifting size $z=4$, each element whose value is −1 in the matrix is lifted to an all-zero matrix of size 4*4, and other elements are lifted to permutation matrices of size 4*4. The permutation matrix may be obtained by performing cyclic shift on an identity matrix I for a corresponding quantity of times, and the quantity of shifts is equal to a value of a corresponding matrix element. As shown in FIG. 1, a corresponding permutation matrix obtained after an element whose value is 0 in the base matrix is lifted is an identity matrix I of size 4*4, a corresponding permutation matrix obtained after an element whose value is 1 is lifted is a matrix obtained by shifting an identity matrix once, and so on. Details are not described herein again.

After being lifted, the base matrix may be used as a parity check matrix used for encoding or decoding of the LDPC code. An LDPC code having a code length $n_H$ and an information sequence length $k_c$ is marked as an $(n_H, k_c)$ LDPC code and may be uniquely determined by the parity check matrix H. The parity check matrix H is a sparse matrix, where each row of the check matrix H represents one parity check equation constraint and corresponds to j coded bits, each column represents one coded bit constrained by mil parity check equations, and any two parity check equations include at most one same coded bit. An example of a parity check matrix H of the LDPC code and a corresponding parity check equation is given in the following formula (1):

$$H = \begin{Bmatrix} \begin{matrix} v_0 & v_1 & v_2 & v_3 & v_4 & v_5 & v_6 & v_7 & v_8 & v_9 \\ 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 1 & 0 & 0 & 1 \\ 0 & 0 & 0 & 1 & 0 & 0 & 0 & 1 & 1 & 1 \end{matrix} \end{Bmatrix} \begin{matrix} \\ c_0 \\ c_1 \\ c_2 \rightarrow \\ c_3 \\ c_4 \end{matrix} \quad (1)$$

$$\begin{cases} v_0 + v_1 + v_2 + v_3 = 0 \\ v_0 + v_4 + v_5 + v_6 = 0 \\ v_1 + v_4 + v_7 + v_8 = 0 \\ v_2 + v_5 + v_6 + v_9 = 0 \\ v_3 + v_7 + v_8 + v_9 = 0 \end{cases}$$

Figure 2:
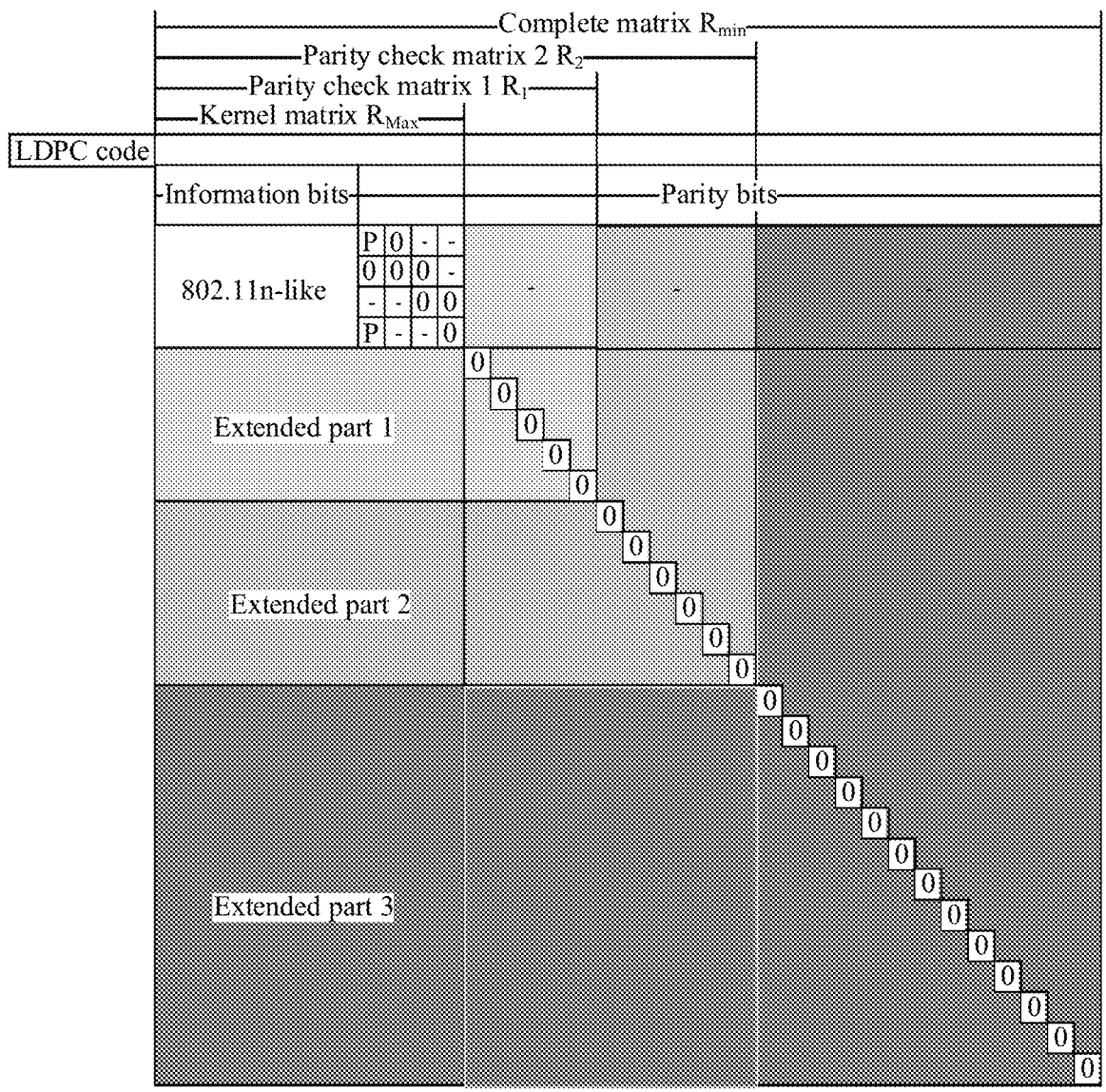
FIG. 2 is a schematic structural diagram of a parity check matrix of an LDPC code.

FIG. 2 shows an example of a parity check matrix H of the LDPC code. As shown in FIG. 2, the parity check matrix includes a kernel matrix and three extended matrix parts. Information data may be encoded and decoded by using four parity check matrices: a kernel matrix; a parity check matrix 1 including the kernel matrix and an extended matrix part 1; a parity check matrix 2 including the kernel matrix, the extended matrix part 1, and an extended matrix part 2; a complete matrix including the kernel matrix, the extended matrix part 1, the extended matrix part 2, and an extended matrix part 3. The parity check matrices each has a Raptor-like structure. The part corresponding to parity bits has dual structures, namely, a bidiagonal structure and a weight-1 column structure. The kernel matrix usually includes a bidiagonal structure part. If a quantity of information bits before coding is k, and a code length of an LDPC coded block generated based on the parity check matrix is n, a code rate is $k_c/n_H$. LDPC coded blocks having different code rates may be obtained by using different parity check matrices for encoding. It may be learned that in the coded blocks, an LDPC codeword generated based on the complete matrix has a largest code length and has a lowest code rate $R_{min}$; an LDPC codeword generated based on the kernel matrix has a smallest code length and has a highest code rate $R_{max}$; an LDPC codeword generated based on the parity check matrix 1 has a code rate $R_1$; and an LDPC codeword generated based on the parity check matrix 2 has a code rate $R_2$, and $R_{min} < R_2 < R_1 < R_{max}$. It should be noted that in the foregoing example, the complete matrix, the kernel matrix, the parity check matrix 1, or the parity check matrix 2 may all be used as a base matrix of the LDPC code, which can be lifted according to the lifting size to obtain a matrix for encoding or decoding.

In the communications system, transmission of information data between communications devices (for example, base stations or terminals) is susceptible to interference and errors, because a radio propagation environment is complex and variable. To reliably send information data, a communications device at a transmit end performs processing such as CRC attachment, channel coding, rate matching, and interleaving on the information data, maps interleaved coded bits into modulation symbols, and sends the modulation symbols to a communications device at a receive end. After receiving the modulation symbols, the receiving device correspondingly performs de-interleaving, rate de-matching, decoding, and CRC to recover the information data. These processes can reduce transmission errors and improve reliability of data transmission.

Figure 3:
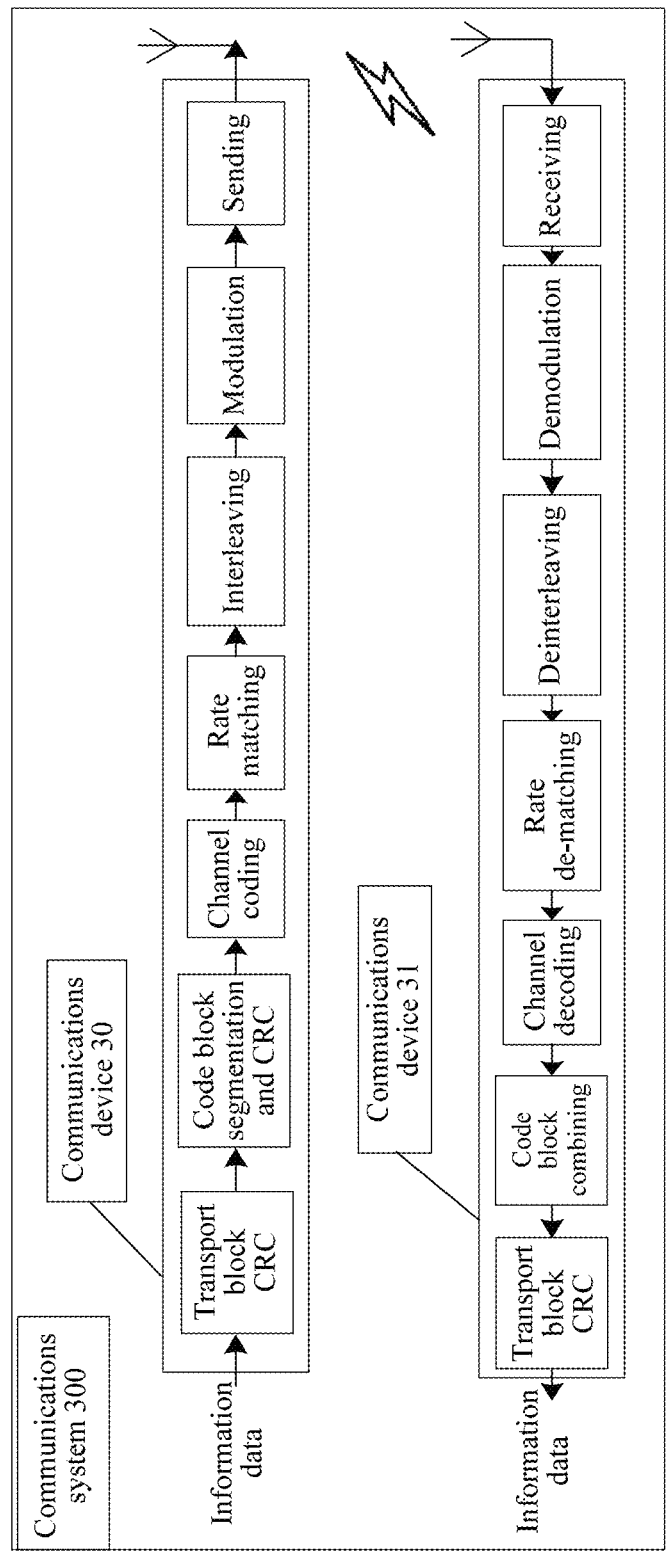
FIG. 3 is a structural diagram of a communications system according to an embodiment of the present invention.

A communications system 300 shown in FIG. 3 may be widely applied to various types of communication such as voice communication and data communication. The communications system may include a plurality of wireless communications devices. For clarity, FIG. 3 shows only a communications device 30 and a communications device 31. Control information or data information is sent and received as an information sequence between the communications device 30 and the communications device 31. The communications device 30 serves as a communications device at a transmit end, to send the information sequence in transport blocks (transmission block, TB), and attaches CRC bits to each transport block. If a size of a transport block with CRC attachment exceeds a largest code block length, the transport block needs to be segmented into several code blocks (code block, CB). Code block CRC bits may also be attached to each code block, or code block group CRC bits may be attached to each group of code blocks, and filler bits may be further inserted into each code block. The communications device 30 performs channel coding on each code block, for example, performs LDPC coding to obtain a corresponding coded block. Each coded block includes information bits and parity bits. If the information bits include a filler bit, the filler bit is usually expressed as "null" (Null).

A coded block or a coded block on which bit rearrangement has been performed is stored in a circular buffer of the communications device 30, and the communications device 30 sequentially obtains a plurality of output bits from the coded block stored in the circular buffer, to obtain an output bit sequence. An output bit is a bit other than a filler bit in the coded block, and therefore the output bit sequence does not include any filler bit. The output bit sequence is sent after being interleaved and mapped into modulation symbols. When performing a retransmission, the communications device 30 selects another output bit sequence from the coded block in the circular buffer and sends the another output bit sequence. If obtaining the output bits sequentially reaches a last bit of the circular buffer, selection of an output bit continues starting from a start bit of the circular buffer.

After demodulating and de-interleaving the received modulation symbols, the communications device 31 stores soft values of the received output bit sequence in a corresponding position in a soft buffer (soft buffer). If retransmissions occur, the communications device 31 combines soft values of output bit sequences in all retransmissions and stores the combined soft values in the soft buffer. Combining herein means that if positions of output bits received at two transmissions are the same, soft values of the output bits received at the two transmissions are combined. Positions in the soft buffer of the communications device 31 are in a one-to-one correspondence with positions in the coded block in the circular buffer of the communications device 30. To be specific, if the position of the output bit in the coded block in the circular buffer of the communications device 30 is a $p^{th}$ bit, the position of the soft value of the output bit in the soft buffer of the communications device 31 is also a $p^{th}$ bit.

The communications device 31 decodes all soft values in the soft buffer to obtain a code block of an information sequence. The communications device 31 may obtain a transport block size. Therefore, a quantity of code blocks into which one transport block is segmented and a length of each code block may be determined. If the code block includes a CRC bit segment, the communications device 31 may further use the CRC bit segment to check the code block. The communications device 31 concatenates all the code blocks into one transport block, and further performs checking and concatenation on transport blocks to finally obtain the information sequence. It may be learned that the communications device 31 performs a reverse process of a method for processing information performed by the communications device 30.

It should be noted that in the embodiments of the present invention, the communications device 30 may be a network device such as a base station in the communications system, and correspondingly the communications device 31 may be a terminal. Alternatively, the communications device 30 may be a terminal in the communications system, and correspondingly the communications device 31 may be a network device such as a base station in the communications system.

For ease of understanding, some terms used in this application are described below.

In this application, terms "network" and "system" are often alternately used, but a person skilled in the art may understand their meanings. The terminal is a device having a communication function, and may include a handheld device having a wireless communication function, an in-vehicle device, a wearable device, a computing device, or another processing device connected to a wireless modem. The terminal may have different names in different networks, for example, user equipment, a mobile station, a subscriber unit, a station, a cellular phone, a personal digital assistant, a wireless modem, a wireless communications device, a handheld device, a laptop computer, a cordless telephone set, or a wireless local loop station. For ease of description, the terminal device is briefly referred to as a terminal in this application. The base station (base station, BS) may also be referred to as a base station device, and is a device deployed in a radio access network to provide a wireless communication function. In different wireless access systems, the base station may have different names. For example, a base station in a universal mobile telecommunications system (Universal Mobile Telecommunications System, UMTS) network is referred to as a NodeB (NodeB), a base station in an LTE network is referred to as an evolved NodeB (evolved NodeB, eNB or eNodeB), a base station in a new radio (new radio, NR) network is referred to as a transmission reception point (transmission reception point, TRP) or a next generation NodeB (generation NodeB, gNB), or base stations in various other evolved networks may also have other names. The present invention is not limited thereto.

Figure 4:
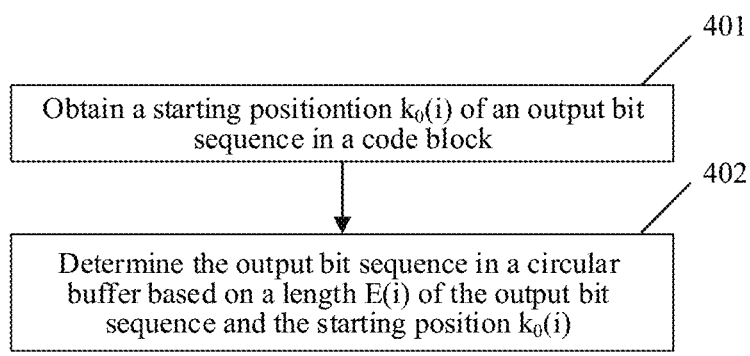
FIG. 4 is a flowchart of a method for processing information according to another embodiment of the present invention.

FIG. 4 is a schematic flowchart of a method for processing information according to an embodiment of the present invention. The method may be applied to a communications system. The communications system includes a communications device 30 and a communications device 31. The method may be implemented by the communications device 30 and includes the following steps.

401: Obtain a starting position $k_0(i)$ of an output bit sequence in a coded block.

In the communications device 30, the coded block is stored in a circular buffer. A size of the coded block may be represented by $N_{CB}$. The coded block may also include one or more filler bits. When the coded block is initially transmission or retransmission, the communications device 30 determines, in the coded block in the circular buffer, the output bit sequence used for the initial transmission or the retransmission. The output bit sequence does not include any filler bit. For ease of description, an $i^{th}$ transmission indicates an initial transmission or a retransmission, i=0 indicates an initial transmission, i>0 indicates a retransmission, and i is an integer. For example, i=1 indicates the first retransmission, i=2 indicates the second retransmission, and so on. An upper limit of retransmissions depends on a maximum retransmission times of the system. An output bit sequence for each initial transmission or retransmission may be a redundancy version of the coded block. $k_0(i)$ indicates a starting position of an output bit sequence for the $i^{th}$ transmission in the coded block of the circular buffer, which may also be referred to as a starting position of a redundancy version rv(i) for the $i^{th}$ retransmission.

402: Determine the output bit sequence in a circular buffer based on a length E(i) of the output bit sequence and the starting position $k_0(i)$.

The communications device 30 may determine the output bit sequence based on the length E(i) of the output bit sequence for the $i^{th}$ transmission and the starting position $k_0(i)$ obtained in step 401. For example, the communications device 30 sequentially obtains E(i) bits starting from a $(k_0(i))^{th}$ bit of the coded block as the output bit sequence. The output bit sequence does not include any filler bit; therefore, if the communications device 30 obtains, as the output bit sequence, the E(i) bits in F(i) bits starting from the $(k_0(i))^{th}$ bit of the coded block, a quantity of filler bits is F(i)−E(i). Therefore, an end location of the output bit sequence is $k_0(i)$+F(i). F(i) is a bit quantity required for sequentially obtaining the E(i) output bits from the coded block starting from $k_0(i)$. F(i) is an integer greater than or equal to 0.

For example, after sending an output bit sequence for the initial transmission, namely, a $0^{th}$ transmission, the communications device 30 receives a negative acknowledgement NACK from the communications device 31. The communications device 30 needs to determine a starting position $k_0(1)$ of an output bit sequence for the $1^{st}$ transmission, namely, the $1^{st}$ redundancy version rv(1). Therefore, the communications device obtains the starting position $k_0(1)$ of the output bit sequence in the coded block stored in the circular buffer, and determines the output bit sequence for the $1^{st}$ transmission, namely, the redundancy version rv(1), based on a length E(1) of the output bit sequence and the starting position $k_0(1)$. The communications device 30 sends the output bit sequence $rv(1)$ to the communications device 31. If the communications device 30 receives the NACK from the communications device 31, the communications device 30 needs to determine a starting position $k_0(2)$ of an output bit sequence for the $2^{nd}$ transmission, namely, the $2^{nd}$ redundancy version $rv(2)$, and determine the output bit sequence for the $2^{nd}$ transmission based on a length $E(2)$ of the output bit sequence and the starting position $k_0(2)$, that is, determine the redundancy version $rv(2)$. The rest can be deduced by analogy. The communications device may end the retransmission of the coded block until the maximum retransmission is reached or the communications device 30 receives a positive acknowledgement ACK from the communications device 31. Certainly, the communications device 30 may perform a plurality of retransmissions without considering the NACK or the ACK from the communications device 31.

During decoding, the communications device 31 at a receive end needs to perform combining and decoding on soft channel bits received in the initial transmission and soft channel bits of redundancy versions. For a coded block obtained through LDPC coding, a quantity of repeated bits or skipped bits between the redundancy versions needs to be reduced to improve decoding performance of the communications device at the receive end.

An LDPC coded block shown in FIG. 5-1 is used as an example. It is assumed that a code rate of a kernel matrix of the LDPC coded block before puncturing is 0.89, and a lowest code rate supported by the LDPC coded block is 0.33. The LDPC coded block includes information bits and redundancy bits. The information bits include systematic to-be-punctured bits and information bits that cannot be punctured. The redundancy bits include parity bits that correspond to weight-2 columns and that cannot be punctured, parity bits that correspond to weight-2 columns and that can be punctured, and parity bits that correspond to weight-1 columns and that can be punctured. Puncturing may also indicate not sending. A punctured bit is a bit not to be sent, and a bit that cannot be punctured means that the bit needs to be sent. The parity bits corresponding to weight-2 columns correspond to a column in a bidiagonal structure part in a parity check matrix, or in other words, correspond to a column in a bidiagonal structure part in a kernel matrix. An output bit sequence eo including the information bits that are not punctured and the parity bits that correspond to weight-2 columns and that are not punctured has a highest code rate.

There are a plurality of sizes affecting decoding performance of the LDPC code. For example, during decoding of the LDPC code, a redundancy part other than the information bits usually needs to be selected in an encoding order to form a code word for decoding. For another example, for the LDPC code, parity bits corresponding to weight-2 columns are punctured to obtain a code rate higher than an original code rate supported by the kernel matrix. During retransmission, the punctured parity bits corresponding to weight-2 columns need to be retransmitted first, and then punctured parity bits in a weight-1 column part are sent. For another example, during retransmission, a higher proportion of repeated redundancy bits indicates poorer decoding performance.

As shown in FIG. 5-2, there are four starting position values $p_0$, $p_1$, $p_2$, and $p_3$. In the initial transmission, an output bit sequence, namely, a redundancy version 0, is obtained starting from the $0^{th}$ starting position $p_0$. In the $1^{st}$ retransmission, an output bit sequence, namely, a redundancy version 1, is obtained starting from the $1^{st}$ starting position $p_1$. The redundancy version 0 and the redundancy version 1 are not continuous. A large quantity of skipped bits are not transmitted, and especially parity bits corresponding to weight-2 columns are not selected. After receiving the two redundancy versions, the communications device at the receive end performs combining and decoding. However, because redundant bits skipped in FIG. 5-2 are not transmitted to the communications device at the receive end, the redundant bits cannot be selected prior to redundant bits in the redundancy version 1 to form a code word for decoding. Consequently, decoding performance is greatly lowered. In addition, the skipped bits in FIG. 5-2 also include punctured parity bits corresponding to weight-2 columns, further degrading the decoding performance.

As shown in FIG. 5-3, in the initial transmission, an output bit sequence, namely, a redundancy version 0, is obtained starting from the $0^{th}$ starting position po. In the $1^{st}$ retransmission, an output bit sequence, namely, a redundancy version 1, is obtained starting from the $1^{st}$ starting position pi. Although the redundancy version 0 and the redundancy version 1 are continuous, if a code rate of the initial transmission is relatively low, there are a relatively large quantity of repeated bits, leading to a loss of the decoding performance.

In step 401, a value of $k_0(i)$ may be $p_k$, and $p_k$ is one of $\{p_0, p_1, p_2 \ldots, p_{k_{max}-1}\}$. In other words, there are $k_{max}$ starting position values. $0 \leq p_k < N_{CB}$, $p_k$ is an integer, k is an integer, $0 \leq k < k_{max}$, $N_{CB}$ is a size of the coded block, and $k_{max}$ is an integer greater than or equal to 4. For example, $k_{max} = 2^n$, and n is an integer greater than or equal to 2; or $k_{max} = Nb$, and Nb is a quantity of columns of a base matrix.

The subscript k in $p_k$ may be a redundancy version starting position number $rvi_{dx}$.

$\{p_0, p_1, p_2 \ldots, _{k_{max}-1}\}$ may be defined in a plurality of manners. For example, the set may be a set including only elements $p_0, p_1, p_2 \ldots, p_{k_{max}-1}$, or may be a subset of another set. The elements in the set $\{p_0, p_1, p_2 \ldots, p_{k_{max}-1}\}$ may be arranged in a particular order, or may not be arranged in a particular order. This is not specifically limited in this application.

In a first possible implementation, the $k_{max}$ values $\{p_0, p_1, p_2 \ldots, p_{k_{max}-1}\}$ may be evenly distributed based on differences. A difference between two values a and b may be represented by $|a-b|$, and $\|$ represents calculating an absolute value. For the value of the starting position of the coded block in the circular buffer, if $p_k \geq p_{k-1}$, a difference between $p_k$ and $p_{k-1}$ is $|p_k - p_{k-1}|$; and if $p_k < p_{k-1}$, the difference between $p_k$ and $p_{k-1}$ is $|(p_k + N_{CB}) - _{k-1}|$. For example, the difference is an integer S. A difference between two adjacent values is S. If k>0, $p_k$ may be obtained based on a previous value $p_{k-1}$. For example, $p_k$ satisfies $p_k = (p_{k-1} + S) \mod N_{CB}$. Alternatively, $p_k$ may be obtained based on $p_0$, and $p_k$ satisfies $p_k = (p_0 + k \cdot S) \mod N_{CB}$. $p_0$ may be an integer multiple of a lifting size, and $p_0 = l \cdot z$, where l is an integer, and $0 \leq l < Nb$. If $p_0 = 0$, the equation may be simplified as that $p_k$ satisfies $p_k = (k \cdot S) \mod N_{CB}$.

The $k_{max}$ values $\{p_0, p_1, p_2 \ldots, p_{k_{max}-1}\}$ may be set based on the size $N_{CB}$ of the coded block. S may be $$\left\lfloor \frac{N_{CB}}{k_{max}} \right\rfloor \text{ or } \left\lceil \frac{N_{CB}}{k_{max}} \right\rceil.$$

In this case, if k>0, $p_k$ satisfies $$p_k = \left(p_{k-1} + \left\lfloor \frac{N_{CB}}{k_{max}} \right\rfloor\right) \bmod N_{CB}$$

or $$p_k = \left(p_{k-1} + \left\lceil \frac{N_{CB}}{k_{max}} \right\rceil\right) \bmod N_{CB}.$$

For another example, $p_k$ satisfies $$p_k = \left(p_0 + \left\lfloor \frac{N_{CB} \cdot k}{k_{max}} \right\rfloor\right) \bmod N_{CB},$$

$$p_k = \left(p_0 + \left\lceil \frac{N_{CB} \cdot k}{k_{max}} \right\rceil\right) \bmod N_{CB},$$

$$p_k = \left(p_0 + k \cdot \left\lfloor \frac{N_{CB}}{k_{max}} \right\rfloor\right) \bmod N_{CB}, \text{ or}$$

$$p_k = \left(p_0 + k \cdot \left\lceil \frac{N_{CB}}{k_{max}} \right\rceil\right) \bmod N_{CB}.$$

$\lceil \ \rceil$ represents rounding up to an integer, and $\lfloor \ \rfloor$ represents rounding down to an integer. For example, 2.1 is rounded up to 3, and is rounded down to 2.

In an example in which the coded block has a length of 215 bits, $k_{max}$ is 8, and the difference between adjacent values is $$\left\lfloor \frac{215}{8} \right\rfloor = 26 \text{ bits,}$$

if $p_0 = 0$, values in $\{p_0, p_1, p_2 \ldots, p_{k_{max}-1}\}$ satisfy $$p_k = \left\lfloor \frac{N_{CB} \cdot k}{k_{max}} \right\rfloor \bmod N_{CB},$$

and are $\{0, 26, 52, 78, 104, 130, 156, 182\}$. It may be learned that in the example, the elements in $\{p_0, p_1, p_2 \ldots, p_{k_{max}-1}\}$ may be distributed in ascending order at equal intervals. It should be noted that this is merely an example for description herein, and this application is not limited thereto. For example, the elements in $\{p_0, p_1, p_2 \ldots, p_{k_{max}-1}\}$ may also be arranged in descending order, and the difference between the adjacent elements may also have other values.

For another example, $k_{max} = Nb$, and Nb is a quantity of columns of the base matrix. $N_{CB}$ is obtained based on Nb·z and optionally through puncturing. Therefore, the difference between the adjacent values may be z. For any value $p_k$, $p_k = (k \cdot z) \bmod N_{CB}$. For example, if Nb=50 and z=4, the values in $\{p_0, p_1, p_2 \ldots, p_{k_{max}-1}\}$ satisfy $p_k$, $p_k = (k \cdot z) \bmod N_{CB}$, and are $\{0, 4, 8, \ldots, 196\}$. It should be noted that this is merely an example for description herein, and this application is not limited thereto.

An increase in $k_{max}$ can reduce a distance between the starting positions of the redundancy versions. The redundancy version determined based on the starting position can also improve decoding performance of the communications device at the receive end. For example, $k_{max}$ may be an integer greater than 4. For example, $k_{max}=5$; or $k_{max}=2^n$, and $k_{max}$ is 8 or above, for example, 8 or 16, where n is an integer greater than 2. For another example, $k_{max}=Nb$, and Nb is the quantity of columns of the base matrix of the coded block. This is merely an example for description herein, and this application is not limited thereto.

In the foregoing method, an interval between redundancy version transmissions does not vary greatly or does not include a large quantity of repeated bit. Therefore, the foregoing method can adapt to various initial transmission code rates, and has relatively stable performance.

In a second possible implementation, the $k_{max}$ values $\{p_0, p_1, p_2 \ldots, p_{k_{max}-1}\}$ may alternatively be set in a manner that differences between adjacent values are varied.

For example, $p_{m+1}$ is used as a demarcation point, $k_{max}-m-2$ values after $p_{m+1}$ may be set in a manner in which differences between adjacent values are in ascending order, as described in the above, $k_{max}$ is an integer greater than or equal to 4. For example, $p_{m+2}-p_{m+1} \leq p_{m+3}-p_{m+2}$. The m+1 value(s) between $p_0$ and $p_{m+1}$ may be evenly distributed based on a difference, which, for example, has a value of $$\left\lfloor \frac{p_{m+1} - p_0}{m+1} \right\rfloor \text{ or } \left\lceil \frac{p_{m+1} - p_0}{m+1} \right\rceil;$$

or may be set in another manner in which differences between adjacent values are varied. This is not limited herein. For example, if $k_{max}=4$, according to $p_{m+2}-p_{m+1} \leq p_{m+3}-p_{m+2}$, and the subscript m+3 of $p_{m+3}$ is less than or equal to $k_{max}-1$, that is m+3≤3, thus m=0, therefore $p_2-p_1 \leq p_3-p_2$. Understandably, for a manner in which differences between adjacent values are varied, $p_2-p_1 < p_3-p_2$, for a manner in which differences between adjacent values are even, $p_2-p_1 = p_3-p_2$.

For example, during initial transmission, an output bit sequence having a high code rate is obtained, and includes information bits and parity bits that correspond to weight-2 columns and that are not punctured, for example, $e_0$ in FIG. 5-1. A length of the output bit sequence is $E_0=(Nb-Mb+j)*z$, where j is a quantity of parity bits corresponding to weight-2 columns or a quantity of parity bits that correspond to weight-2 columns and that are not punctured. A value of $p_{m+1}$ may be $(Nb-Mb+j)*z$.

If $p_k > (Nb-Mb+j)*z$, $p_k$ satisfies $p_k - p_{k-1} \leq p_{k+1} - p_k$, where $m+1 < k < k_{max}-1$. As described in the above, $k_{max}$ is an integer greater than or equal to 4. If $k_{max}=4$, $k_{max}-1=3$, that is to say m+1<k<3, as k is an integer, thus k=2, m=0. Therefore $p_2-p_1 \leq p_3-p_2$.

If $p_k < (Nb-Mb+j)*z$, a difference between adjacent values in the m+1 value(s) between $p_0$ and $p_{m+1}$ is $$\left\lfloor \frac{p_{m+1} - p_0}{m+1} \right\rfloor \text{ or } \left\lceil \frac{p_{m+1} - p_0}{m+1} \right\rceil.$$

For example, for k<m+1, $p_k$ satisfies $$p_k = \left(p_0 + \left\lfloor \frac{(p_{m+1} - p_0) \cdot k}{m+1} \right\rfloor\right) \bmod p_{m+1} \text{ or}$$

$$p_k = \left(p_0 + \left\lceil \frac{(p_{m+1} - p_0) \cdot k}{m+1} \right\rceil\right) \bmod p_{m+1}.$$

If $p_k=(Nb-Mb+j)*z$, that is, $p_k=p_{m+1}$, and k=m+1.

According to the method, starting positions are more densely distributed at a position closer to information bits, and starting positions are more sparsely distributed at a position closer to a last bit of the coded block.

The base matrix shown in FIG. 1 is used as an example. $N_b=38$, $M_b=13$, and $z=4$. The last four columns in the kernel matrix $H_k$ are a bidiagonal structure part, to be specific, corresponding columns of parity bits corresponding to weight-2 columns. Therefore, a quantity of the parity bits corresponding to weight-2 columns is four. If two columns are not punctured, a quantity of parity bits that correspond to weight-2 columns and that are not punctured is two. If j is a quantity of parity bits corresponding to weight-2 columns, $E_{r0}=116$. If j is a quantity of parity bits that correspond to weight-2 columns and that are not punctured, $E_{r0}=108$. In an example in which j is the quantity of parity bits that correspond to weight-2 columns and that are not punctured, $k_{max}$ is 8, and the coded block has a length of 152 bits, $p_4=E_{r0}=108$, $p_0=2$, and three values $p_1$, $p_2$, and $p_3$ exist between $p_0$ and $p_4$. A difference between two adjacent values is $$\left\lfloor \frac{106}{4} \right\rfloor = 26.$$

Three values $p_5$, $p_6$, and $p_7$ exist between $p_4$ and the end bit of the coded block, with differences between them being in decreasing order. The differences are sequentially 6, 10, and 14. The $k_{max}$ values are {2, 28, 54, 80, 108, 114, 124, 138}. It should be noted that the distribution of the elements in {$p_0$, $p_1$, $p_2$ ..., $p_{k_{max}-1}$} in ascending order is merely an example herein. It may be understood that this application is not limited thereto, the elements in {$p_0$, $p_1$, $p_2$ ..., $p_{k_{max}-1}$} may alternatively be distributed in descending order, and an interval between adjacent elements in {$p_0$, $p_1$, $p_2$ ..., $p_{k_{max}-1}$} may alternatively be another value.

For the value $p_k$ in {$p_0$, $p_1$, $p_2$ ..., $p_{k_{max}-1}$}, $k_0(i)$ in step 401 may be obtained in a plurality of manners.

Based on the first implementation or the second implementation, in a third possible implementation, if i>0, the starting position $k_0(i)$ is determined based on a starting position $k_0(i-1)$ of a previous transmission output bit sequence and a length $E(i-1)$ of the previous transmission output bit sequence.

For ease of description, a direction from a last position of the previous transmission output bit sequence to the last bit (an $(N_{CB}-1)^{th}$ bit) of the coded block is used as a front-to-end direction, and a direction from the last position of the previous transmission output bit sequence to a start bit (a $0^{th}$ bit) of the coded block is used as an end-to-front direction.

For example, to reduce a quantity of repeated redundancy bits, the starting position $k_0(i)$ may be obtained in a front-to-end direction based on the starting position $k_0(i-1)$ of the previous transmission output bit sequence and the length $E(i-1)$ of the previous transmission output bit sequence. The output bit sequence does not include any filler bit; therefore, if $F(i-1)$ is a bit quantity required for sequentially obtaining the $E(i-1)$ output bits from the coded block starting from $k_0(i-1)$, the last position of the previous obtained output bit sequence is $(k_0(i-1)+F(i-1)-1) \bmod N_{CB}$. A value $p_k$ of a first starting position in the front-to-end direction from the last position of the previous obtained output bit sequence is used as $k_0(i)$. If the last position of the previous obtained output bit sequence is greater than a largest value in {$p_0$, $p_1$, $p_2$ ..., $p_{k_{max}-1}$}, $p_k$ is a smallest value in {$p_0$, $p_1$, $p_2$ ..., $p_{k_{max}-1}$}.

It may be learned that $p_k$ is a minimum value satisfying $p_k \geq ((k_0(i-1)+F(i-1)) \bmod N_{CB})$. If no value in {$p_0$, $p_1$, $p_2$ ..., $p_{k_{max}-1}$} satisfies $p_k \geq ((k_0(i-1)+F(i-1)) \bmod N_{CB})$, in other words, $((k_0(i-1)+F(i-1)) \bmod N_{CB})$ is greater than the largest value in {$p_0$, $p_1$, $p_2$ ..., $p_{k_{max}-1}$}, $p_k$ is the smallest value in {$p_0$, $p_1$, $p_2$ ..., $p_{k_{max}-1}$}.

The values {2, 28, 54, 80, 108, 114, 124, 138} in the foregoing implementation are used as an example. The starting position $k_0(i-1)$ of the previous transmission output bit sequence is 2, and the length $E(i-1)$ of the previous transmission output bit sequence is 25 bits. There are 5 filler bits; therefore, the bit quantity $F(i-1)$ required for sequentially obtaining the $E(i-1)$ output bits from the coded block starting from $k_0(i-1)$ last time is 30. For the output bit sequence $k_0(i)$ for the $i^{th}$ transmission, $k_0(i)=54$ if the method of obtaining the starting position in a front-to-end direction in this embodiment is used. If the starting position $k_0(i-1)$ of the previous transmission output bit sequence is 124, the length $E(i-1)$ of the previous transmission output bit sequence is 30 bits, and there are no filler bits, the bit quantity required for sequentially obtaining the $E(i-1)$ output bits from the coded block starting from $k_0(i-1)$ last time is 30, and $k_0(i)=2$. It should be noted that this is merely an example herein, and this application is not limited thereto.

For another example, to meet a requirement of sequential decoding, the starting position $k_0(i)$ is obtained in an end-to-front direction based on the starting position $k_0(i-1)$ of the previous transmission output bit sequence and the length $E(i-1)$ of the previous transmission output bit sequence. The output bit sequence does not include any filler bit; therefore, if $F(i-1)$ is a bit quantity required for sequentially obtaining $E(i-1)$ output bits from the coded block starting from $k_0(i-1)$, the last position of the previous obtained output bit sequence is $(k_0(i-1)+F(i-1)-1) \bmod N_{CB}$. A value $p_k$ of the first starting position in the end-to-front direction from the last position of the previous obtained output bit sequence is used as $k_0(i)$. If the end location of the previous obtained output bit sequence is less than a smallest value in {$p_0$, $p_1$, $p_2$ ..., $p_{k_{max}-1}$}, $p_k$ is a largest value in {$p_0$, $p_1$, $p_2$ ..., $p_{k_{max}-1}$}. It may be learned that $p_k$ is a maximum value satisfying $p_k \leq ((k_0(i-1)+F(i-1)) \bmod N_{CB})$. If no value in {$p_0$, $p_1$, $p_2$ ..., $p_{k_{max}-1}$} satisfies $p_k \leq ((k_0(i-1)+F(i-1)) \bmod N_{CB})$, in other words, $((k_0(i-1)+F(i-1)) \bmod N_{CB})$ is less than the smallest value {$p_0$, $p_1$, $p_2$ ..., $p_{k_{max}-1}$}, $p_k$ is the largest value in {$p_0$, $p_1$, $p_2$ ..., $p_{k_{max}-1}$}.

The values {2, 28, 54, 80, 108, 114, 124, 138} in the foregoing embodiment and that the length of the coded block is 152 bits are still used as an example. The starting position $k_0(i-1)$ of the previous transmission output bit sequence is 2, and the length $E(i-1)$ of the previous transmission output bit sequence is 25 bits. There are 5 filler bits. Therefore, the bit quantity $F(i-1)$ required for sequentially obtaining the $E(i-1)$ output bits from the coded block starting from $k_0(i-1)$ last time is 30. For the output bit sequence $k_0(i)$ for the transmission, $k_0(i)=28$ if the method of obtaining the starting position in an end-to-front direction is used. If the starting position $k_0(i-1)$ of the previous transmission output bit sequence is 124, the length $E(i-1)$ of the previous transmission output bit sequence is 20 bits, and there are nine filler bits, the bit quantity $F(i-1)$ required for sequentially obtaining the $E(i-1)$ output bits from the coded block starting from $k_0(i-1)$ last time is 29, and $k_0(i)=138$. It should be noted that this is merely an example herein, and this application is not limited thereto.

For another example, to compensate decoding performance losses caused by repeating bits and by skipping redundancy bits, with reference to results of obtaining $k_0(i)$ in an end-to-front direction and obtaining $k_0(i)$ in a front-to-end direction in the foregoing two examples, a value of one of the two results that has a smaller difference with the end location of the previous obtained output bit sequence is used as $k_0(i)$. If $p_0 \leq ((k_0(i-1)+F(i-1)) \mod N_{CB}) \leq p_{k_{max}-1}$, $p_k$ is a value in $\{p_0, p_1, p_2 \ldots, p_{k_{max}-1}\}$ that has a smallest difference with $((k_0(i-1)+F(i-1)) \mod N_{CB})$; or if $((k_0(i-1)+F(i-1)) \mod N_{CB})$ is less than a smallest value in $\{p_0, p_1, p_2 \ldots, p_{k_{max}-1}\}$ or $((k_0(i-1)+F(i-1)) \mod N_{CB})$ is greater than a largest value in $\{p_0, p_1, p_2 \ldots, p_{k_{max}-1}\}$, $p_k$ is one of the smallest value in $\{p_0, p_1, p_2 \ldots, p_{k_{max}-1}\}$ and the largest value $p_{k_{max}-1}$ in $\{p_0, p_1, p_2 \ldots, p_{k_{max}-1}\}$ and has a smaller difference with $((k_0(i-1)+F(i-1)) \mod N_{CB})$. In a possible implementation, $p_{k+}$ and $p_{k-}$ may be determined first. $p_{k+}$ is a value of the first starting position in the front-to-end direction from the last position of the previous obtained output bit sequence, $p_{k-}$ is a value of the first starting position in the end-to-front direction from the last position of the previous obtained output bit sequence, and $p_k$ is one of $p_{k+}$ and $P_{k-}$ has a smaller difference with $((k_0(i-1)+F(i-1)) \mod N_{CB})$. If a difference between $p_{k+}$ and $((k_0(i-1)+F(i-1)) \mod N_{CB})$ is equal to that between $p_{k-}$ and $((k_0(i-1)+F(i-1)) \mod N_{CB})$, $p_k$ may be selected from the two arbitrarily or based on a value determining direction.

The values {2, 28, 54, 80, 108, 114, 124, 138} in the foregoing embodiment and that the length of the coded block is 152 bits are still used as an example. The starting position k0(i−1) of the previous transmission output bit sequence is 2, and the length E(i−1) of the previous transmission output bit sequence is 26 bits. The bit quantity F(i−1) required for sequentially obtaining the E(i−1) output bits from the coded block starting from k0(i−1) last time is 30. For the output bit sequence $k_0(i)$ for the $i^{th}$ transmission, $k_0(i)=28$ if the method in this embodiment is used to obtain the starting position. If $k_0(i-1)$ is 124 bits, the length E(i−1) of the previous transmission output bit sequence is 29 bits, and the bit quantity F(i−1) required for sequentially obtaining the E(i−1) output bits from the coded block starting from $k_0(i-1)$ last time is 30, a value obtained in the front-to-end direction is $p_0=2$, a difference between $p_0$ and $((k_0(i-1)+F(i-1)) \mod N_{CB})$ is 1, a value obtained in the end-to-front direction is $p_7=138$, and a difference between $p_7$ and $((k_0(i-1)+F(i-1)) \mod N_{CB})$ is 15. Therefore, $k_0(i)=p_0=2$. It should be noted that this is merely an example herein, and this application is not limited thereto.

For another example, to compensate decoding performance losses caused by repeating bits and by skipping redundancy bits, a direction for obtaining the starting position $k_0(i)$ in the $i^{th}$ transmission is determined based on a correspondence between a quantity i of transmissions and the direction for obtaining the starting position $k_0(i)$, and the starting position $k_0(i)$ is obtained based on the last position of the previous transmission output bit sequence and the determined direction for obtaining the starting position $k_0(i)$. A table of the quantity i of transmissions and the direction for obtaining the starting position $k_0(i)$, for example, Table 1, may be set in the communications device. A largest quantity of retransmissions is three, and no obtaining direction needs to be set for the initial transmission.

TABLE 1

| Quantity of transmissions | Obtaining direction |
|---|---|
| 1 | front-to-end |
| 2 | end-to-front |
| 3 | end-to-front |

The values {2, 28, 54, 80, 108, 114, 124, 138} in the foregoing embodiment and that the length of the coded block is 152 bits are still used as an example. If a starting position $k_0(0)$ of an output bit sequence for the initial transmission is 2, a length E(0) of the output bit sequence for the initial transmission is 20 bits, and a quantity of filler bits is 10, F(0)=30 bits. It is assumed that there are a same quantity of filler bits each time when an output bit sequence is obtained, an output bit sequence for each transmission has a same length, and the starting position is obtained by using the correspondence in Table 1 above. For an output bit sequence for the $1^{st}$ transmission, a starting position $k_0(1)$ is obtained in a front-to-end direction, and $k_0(1)=54$. For an output bit sequence for the $2^{nd}$ transmission, a starting position $k_0(2)$ is obtained in an end-to-front direction, and $k_0(2)=80$. For an output bit sequence for the $3^{rd}$ transmission, a starting position $k_0(3)$ is obtained, and $k_0(3)=108$. It should be noted that this is merely an example herein, and this application is not limited thereto.

"End-to-front" and "front-to-end" in the obtaining directions may be indicated by using particular numerical values, and are not limited to a literal expression manner. For example, 0 represents "end-to-front", and 1 represents "front-to-end"; or another numerical expression manner is used. The correspondence between the quantity i of transmissions and the direction for obtaining the starting position $k_0(i)$ may alternatively be defined in another form. This embodiment of the present invention is not limited thereto.

The direction for obtaining the starting position of the output bit sequence for the $i^{th}$ transmission may be determined based on the quantity i of transmissions. The starting position $k_0(i)$ is obtained in an end-to-front direction based on the direction for obtaining the starting position of the output bit sequence for the $i^{th}$ transmission, the starting position $k_0(i-1)$ of the previous transmission output bit sequence, and the length E(i−1) of the previous transmission output bit sequence.

Based on the first implementation or the second implementation, in a fourth possible implementation, an order in which the starting position is obtained during each transmission may be defined, and a value selection order of the subscript k in $p_k$ during each transmission may also be defined. The order may be indicated to the communications device at the receive end, or may be prestored in the communications device at the transmit end and the communications device at the receive end.

The subscript k in $p_k$ may be a redundancy version starting position number $rv_{idx}$, a redundancy version starting position number in the $i^{th}$ transmission may be represented as $rv_{idx}(i)$, and the starting position $k_0(i)$ may be determined based on the redundancy version starting position number $rv_{idx}(i \mod k_{max})$.

A starting position obtaining method based on a fixed order may be used. In an embodiment, a value selection order of $rv_{idx}$ may be defined. A quantity of values in the value selection order may be $k_{max}$, or may be a largest quantity $R_{max}$ of retransmissions. For example, when $k_{max}=8$, the value selection order of $rv_{idx}$ is sequentially 0, 3, 6, 2, 5, 7, 4, and 1. For the initial transmission, an output bit sequence is determined starting from the $p_0^{th}$ bit. For the first transmission, $k_0(1)=p_3$, and an output bit sequence is determined starting from the $p_3^{th}$ bit. For the second transmission, $k_0(2)=p_6$, and the output bit sequence is determined starting from the $p_6^{th}$ bit. The rest can be deduced by analogy. For the $k_{maxt}^{th}$ transmission, the output bit sequence is determined starting from the $p_0^{th}$ bit again. To be specific, for the $i^{th}$ transmission, $k=rv_{idx}(i \mod k_{max})$, and $k_0(i)=p_k$. For another example, the maximum quantity $R_{max}$ of retransmissions is 3, and a value selection order set of $rv_{idx}$ is {0, 2, 3, 1}. In this case, for the initial transmission, and the output bit sequence is determined starting from the $p_0^{th}$ bit. For the $1^{st}$ transmission, $k_0(1)=p_2$, and the output bit sequence is determined starting from the $p_3^{th}$ bit. For the $2^{nd}$ transmission, $k_0(2)$ is $p_3$. For the $i^{th}$ transmission, $k=rv_{idx}(i \bmod R_{max})$, and $k_0(i)=p_k$.

Further, the value selection order of $rv_{idx}$ may also be determined based on a value of an initial transmission code rate, or may be determined based on a length E of an output bit sequence for each transmission and a lifting size z. In a non-adaptive retransmission scenario, a length of an output bit sequence in the initial transmission is equal to that of an output bit sequence in the retransmission. For example, the value selection order of $rv_{idx}$ is determined based on $$\left\lceil \frac{E}{z} \right\rceil.$$

For example, $k_{max}=8$, and a 66*82 LDPC matrix is used. A quantity of columns of information bits is 16. For the coded block, for a correspondence between the value selection order of rvidx and the code rate of the initial transmission, refer to Table 2. For example, $R_0 \geq 0.8$, and the value selection order of $rv_{idx}$ is {0, 2, 4, 6}.

TABLE 2

| Initial transmission code rate $R_0$ | Value selection order of $rv_{idx}$ |
| --- | --- |
| $R_0 \geq 0.8$ | 0, 2, 4, 6 |
| $0.53 \leq R_0 < 0.8$ | 0, 3, 6, 2 |
| $R_0 < 0.53$ | 0, 4, 2, 6 |

For another example, $k_{max}=8$, and a 66*82 LDPC matrix is used. A quantity of columns of information bits is 16. For the coded block, refer to Table 3 for a correspondence between the value selection order of $rv_{idx}$ and the initial transmission code rate. For example, $$20 < \left\lceil \frac{E}{z} \right\rceil \leq 30,$$

and the value selection order of $rv_{idx}$ is {0, 3, 6, 2}.

TABLE 3

| Length E of output bit sequence and lifting size z | Value selection order of $rv_{idx}$ |
| --- | --- |
| $\left\lceil \frac{E}{z} \right\rceil \leq 20$ | 0, 2, 4, 6 |
| $20 < \left\lceil \frac{E}{z} \right\rceil \leq 30$ | 0, 3, 6, 2 |
| $\left\lceil \frac{E}{z} \right\rceil > 30$ | 0, 4, 2, 6 |

This manner is suitable for non-adaptive retransmission, and information about the starting position does not need to be indicated to the communications device at the receive end before each time of sending.

The starting position $k_0(i)$ of the output bit sequence in the coded block may alternatively be obtained based on $rv_{idx}$ indicated by the communications device at the transmit end. This manner is suitable for adaptive retransmission.

In a fifth possible implementation, for a retransmission, to be specific, for i>0, the output bit sequence for the $i^{th}$ transmission and an output bit sequence for the $(i-1)^{th}$ transmission are connected end to end. In this implementation, $k_0(i)$ is determined based on a starting position $k_0(i-1)$ of a previous transmission output bit sequence and a length $E(i-1)$ of the previous transmission output bit sequence. The output bit sequence does not include any filler bit. Therefore, $F(i-1)$ may be obtained based on $k_0(i-1)$ and $E(i-1)$. $F(i-1)$ is a bit quantity required for sequentially obtaining $E(i-1)$ output bits from the coded block starting from $k_0(i-1)$. $k_0(i)=(k_0(i-1)+F(i-1)) \bmod N_{CB}$. In this implementation, output bit sequences of two adjacent transmissions are consecutive, and no repeated bit exists between the two output bit sequences, so that when such output bit sequences are sent to the communications device at the receive end, relatively good decoding performance can be achieved.

Further, based on the retransmission manner with end-to-end connection, after all bits of the coded block have been transmitted once, an offset $E_{offset}$ is added for each retransmission, to be specific, $k_0(i)=(k_0(i-1)+F(i-1)+E_{offset}) \bmod N_{CB}$. In this implementation, if the end bit of the coded block is already transmitted, $k_0(i)=(k_0(i-1)+F(i-1)+E_{offset}) \bmod N_{CB}$; otherwise, $k_0(i)=(k_0(i-1)+F(i-1)) \bmod N_{CB}$. In this way, after all the bits are transmitted, an offset is added for each retransmission, so that a quantity of repeated bits is reduced, thereby reducing a decoding performance loss.

Optionally, after the method for processing information is performed, the communications device may further process the output bit sequence, so that the output bit sequence is used during sending or receiving. For example, the processing includes interleaving the output bit sequence, mapping the output bit sequence to modulation symbols, and the like. For the processing, refer to a corresponding processing method in the prior art, and details are not described herein.

Figure 6:
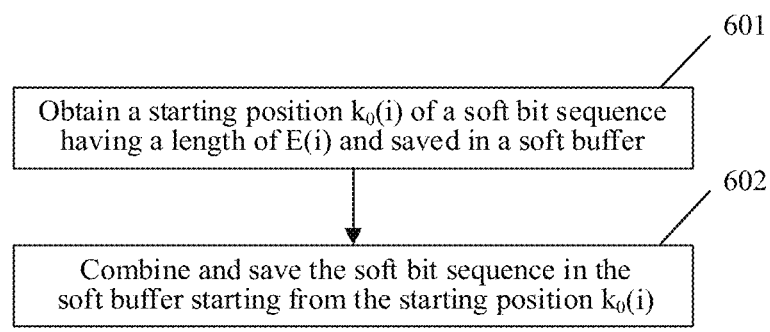
FIG. 6 is a flowchart of a method for processing information according to another embodiment of the present invention.

FIG. 6 is a flowchart of a method for processing information according to an embodiment of the present invention. The method may be applied to a communications system. The communications system includes a communications device 30 and a communications device 31. The method may be implemented by the communications device 31 and includes the following steps.

601: Obtain a starting position $k_0(i)$ of a soft bit sequence having a length of E(i) stored in a soft buffer.

602: Combine and store the soft bit sequence in step 601 in the soft buffer starting from the starting position $k_0(i)$.

The communications device 30 sends the output bit sequence obtained in the foregoing embodiments to the communications device 31. It may be understood that the output bit sequence in the foregoing embodiments is an output bit sequence obtained after rate matching, the communications device 30 may perform processing such as interleaving and modulation on the output bit sequence obtained after the rate matching and send a signal corresponding to the output bit sequence, and the communications device 31 receives the output signal and performs demodulation and de-interleaving on the output signal, to obtain a soft bit sequence corresponding to the output bit sequence. To be specific, one bit in the output bit sequence corresponds to one soft channel bit (soft channel bit) in the soft bit sequence. Positions of the soft channel bits stored in the soft buffer of the communications device 31 are in a one-to-one correspondence with positions in the coded block in the circular buffer of the communications device 30. A size of the soft buffer and a size of the coded block in the circular buffer are also the same and may be $N_{CB}$.

For example, an output bit sent by the communications device 30 is 1, and after channel transmission, the communications device 31 obtains a soft channel bit corresponding to the output bit, where the soft channel bit is 1.45. If a position of the output bit in the coded block is the $5^{th}$ bit, the $5^{th}$ soft channel bit in the soft buffer of the communications device 31 is 1.45. It should be noted that this is merely an example for description herein, and this embodiment of the present invention is not limited thereto. If the output bit sequence obtained by the communications device 30 includes nc output bits, the communications device 31 may obtain nc corresponding soft channel bits. If receiving soft channel bits of a same position at two times, the communications device 31 combines the two soft values. For example, if a soft channel bit received in the $1^{st}$ transmission is 1.45 and a soft channel bit received in the $2^{nd}$ transmission is 0.5, 1.95 is obtained after combining. It should be noted that this is merely an example herein, and this application is not limited thereto.

It may be learned that the starting position $k_0(i)$ and the obtaining manner thereof have features corresponding to the foregoing embodiments. Refer to the descriptions in the foregoing embodiments, and details are not described herein again. It should be noted that in the communications device 30, the starting position is relative to the coded block in the circular buffer; in the communications device 31, the starting position is relative to the soft buffer; on a side of the communications device 30, the output bit sequence is determined in the coded block in the circular buffer, and on a side of the communications device 31, the received soft bit sequence are stored in the soft buffer.

Figure 7:
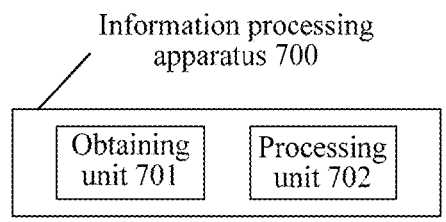
FIG. 7 is a structural diagram of an apparatus for processing information according to another embodiment of the present invention.

FIG. 7 is a schematic structural diagram of an apparatus 700 for processing information. The apparatus may be applied to the communications device 30 in the communications system shown in FIG. 3. The apparatus 700 may also be referred to as a rate matching apparatus. The apparatus 700 may be configured to implement the foregoing method embodiments. Refer to the descriptions in the foregoing method embodiments, and details are not described herein again.

The apparatus 700 may include an obtaining unit 701 and a processing unit 702.

Figure 8:
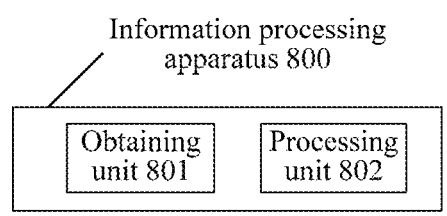
FIG. 8 is a structural diagram of an apparatus for processing information according to another embodiment of the present invention.

The obtaining unit 701 is configured to obtain a starting position $k_0(i)$ of an output bit sequence in a coded block. The processing unit 702 is configured to determine the output bit sequence in the coded block based on a length E(i) of the output bit sequence and the starting position $k_0(i)$. The coded block is stored in a circular buffer, and i is an integer greater than or equal to 0. For details about how to obtain $k_0(i)$ and determine the output bit sequence based on E(i) and $k_0(i)$, refer to the descriptions in the foregoing method embodiments FIG. 8 is a schematic structural diagram of an apparatus 800 for processing information. The apparatus may be applied to the communications device 31 in the communications system shown in FIG. 3. The apparatus 800 may also be referred to as a rate de-matching apparatus. The apparatus 800 may be configured to implement the foregoing method embodiments. For details, refer to the descriptions in the foregoing method embodiments. The apparatus 800 may include an obtaining unit 801 and a processing unit 802.

The obtaining unit 801 is configured to obtain a starting position $k_0(i)$ of a soft bit sequence having a length of E(i) stored in a soft buffer. The processing unit 802 is configured to combine and store the soft bit sequence obtained by the obtaining unit 801 in the soft buffer starting from the starting position $k_0(i)$.

Figure 9:
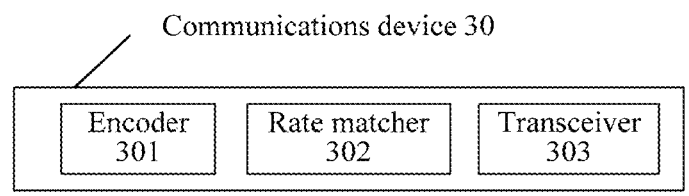
FIG. 9 is a structural diagram of a communications device according to another embodiment of the present invention.

FIG. 9 is a schematic structural diagram of a communications device. The communications device may be applied to the communications system shown in FIG. 3. The communications device 30 may include an encoder 301, a rate matcher 302, and a transceiver 303. The encoder 301 may also be referred to as an encoding unit, an encoding circuit, or the like, and is mainly configured to encode information data. The rate matcher 302 may also be referred to as a rate matching unit, a rate matching circuit, or the like, is mainly configured to determine, based on a coded block obtained by the encoder 301 by encoding, an output bit sequence to be sent, for example, configured to determine the output bit sequence in the foregoing embodiments, and may include, for example, the apparatus 700 in FIG. 7. The transceiver 303 may also be referred to as a transceiver unit, a transceiver, a transceiver circuit, or the like, and is mainly configured to receive and send radio frequency signals, for example, configured to send the output bit sequence in the foregoing embodiments to the communications device 31. The communications device 30 may further include other components, such as a component configured to generate a transport block CRC, a component configured to perform code block segmentation and CRC check, an interleaver, and a modulator, which can be respectively configured to implement functions of parts of the communications device 30 in FIG. 3.

It should be noted that the communications device 30 may include one or more memories and one or more processors. The memory stores instructions. The processor is coupled to the memory, to execute the instructions in the memory to perform steps described in the method embodiments. The memory may further include other instructions for the processor to execute to perform functions of other parts of the communications device 30, for example, code block segmentation, CRC check, interleaving, and modulation.

Figure 10:
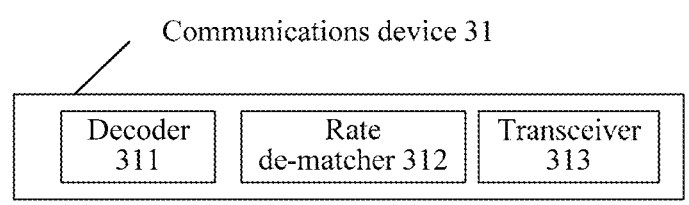
FIG. 10 is a structural diagram of a communications device according to another embodiment of the present invention.

FIG. 10 is a schematic structural diagram of a communications device. The communications device may be applied to the communications system shown in FIG. 3. The communications device 31 may include a decoder 311, a rate de-matcher 312, and a transceiver 313. The rate de-matcher 312 may also be referred to as a rate de-matching unit or a rate de-matching circuit, may be configured to combine soft channel bits, for example, configured to combine and store the soft channel bits of the output bit sequence in the foregoing embodiments in a soft buffer, and may include, for example, the apparatus 800 in FIG. 8. The decoder 311 may also be referred to as a decoding unit or a decoding circuit, and is mainly configured to decode a received signal, for example, configured to decode a soft channel bit in the soft buffer. The transceiver 313 may also be referred to as a transceiver unit, a transceiver, a transceiver circuit, or the like, and is mainly configured to receive and send radio frequency signals, for example, configured to receive the output bit sequence in the foregoing embodiments that is sent by the communications device 30. The communications device 31 may further include other components, such as a component configured to perform CRC check on a transport block, a component configured to perform code block concatenation, a deinterleaver, and a demodulator, which can be respectively configured to implement functions of parts of the communications device 31 in FIG. 3.

It should be noted that the communications device 31 may include one or more memories and processors, to implement the functions of the parts of the communications device 31 in FIG. 3. A dedicated memory and processor may be disposed for each component. Alternatively, a plurality of components share a same memory and processor.

It should be noted that the communications device 31 may include one or more memories and one or more processors. The memory stores instructions. The processor is coupled to the memory, to execute the instruction in the memory to perform steps described in the method embodiments. The memory may further include other instructions for the processor to execute to perform functions of other parts of the communications device 30, for example, code block concatenation, deinterleaving, and demodulation.

A person skilled in the art may further understand that various illustrative logical blocks (illustrative logic block) and steps (step) that are listed in the embodiments of the present invention may be implemented by using electronic hardware, computer software, or a combination thereof. Whether the functions are implemented by using hardware or software depends on particular applications and a design requirement of the entire system. A person skilled in the art may use various methods to implement the functions for each particular application, but such an implementation should not be construed as going beyond the scope of the embodiments of the present invention.

The various illustrative logical units and circuits described in the embodiments of the present invention may implement or operate the described functions by using a design of a general purpose processor, a digital signal processor, an application-specific integrated circuit (ASIC), a field programmable gate array (FPGA) or another programmable logical apparatus, a discrete gate or transistor logic, a discrete hardware component, or any combination thereof. The general purpose processor may be a microprocessor. Optionally, the general purpose processor may also be any conventional processor, controller, microcontroller, or state machine. The processor may also be implemented by a combination of computing apparatuses, for example, a digital signal processor and a microprocessor, a plurality of microprocessors, one or more microprocessors in conjunction with a digital signal processor core, or any other similar configuration.

Steps of the methods or algorithms described in the embodiments of the present invention may be directly embedded in hardware, in instructions executed by a processor, or in a combination thereof. The memory may be a RAM memory, a flash memory, a ROM memory, an EPROM memory, an EEPROM memory, a register, a hard disk, a removable hard disk, a CD-ROM, or any other form of storage medium in the art. For example, the memory may be connected to the processor so that the processor may read information from the memory and write information to the memory. Optionally, the memory may be further integrated into a processor. The processor and the memory may be disposed in an ASIC, and the ASIC may be disposed in UE. Optionally, the processor and the memory may be disposed in different components of the UE.

With descriptions of the foregoing implementations, a person skilled in the art may clearly understand that the present invention may be implemented by hardware, firmware or a combination thereof. When implemented by using a software program, the methods may be fully or partially implemented in a form of a computer program product, and the computer program product includes one or more computer instructions. When the computer instructions are loaded and executed on the computer, the procedure or functions according to the embodiments of the present invention are all or partially generated. When the present invention is implemented by using a software program, the foregoing functions may be stored in a computer readable medium or transmitted as one or more instructions or code in the computer readable medium. The computer may be a general-purpose computer, a dedicated computer, a computer network, or other programmable apparatuses. The computer instructions may be stored in a computer readable storage medium, or may be transmitted from a computer readable storage medium to another computer readable storage medium. The computer readable medium includes a computer storage medium and a communications medium, where the communications medium includes any medium that cause a computer program to be transmitted from one place to another. The storage medium may be any available medium accessible to a computer. The following provides an example but does not impose a limitation: The computer readable medium may include a RAM, a ROM, an EEPROM, a CD-ROM, or another optical disc storage or a disk storage medium, or another magnetic storage device, or any other medium that can be used to carry or store expected program code in a form of instructions or data structures and can be accessed by a computer. In addition, any connection may be appropriately defined as a computer readable medium. For example, if software is transmitted from a website, a server or another remote source by using a coaxial cable, an optical fiber/cable, a twisted pair, a digital subscriber line (DSL) or wireless technologies such as infrared ray, radio and microwave, and the coaxial cable, optical fiber/cable, twisted pair, DSL or wireless technologies such as infrared ray, radio and microwave are included in a definition of a medium to which they belong. For example, a disk (Disk) and disc (disc) used in the present invention includes a compact disc (CD), a laser disc, an optical disc, a digital versatile disc (DVD), a floppy disk and a Blu-ray disc, where the disk generally copies data by a magnetic means, and the disc copies data optically by a laser means. The foregoing combination should also be included in the protection scope of the computer readable medium.

In conclusion, what is described above is merely example embodiments of the technical solutions of the present invention, but is not intended to limit the protection scope of the present invention. Any modification, equivalent replacement, or improvement made without departing from the principle of the present invention shall fall within the protection scope of the present invention.

What is claimed is:

1. A method for performing rate matching in a communications system, comprising:

obtaining, by a communication device, a size of a coded block $N_{CB}$;

obtaining, by the communication device, a starting position $k_0(i)$ of an output bit sequence in the coded block, wherein i is an integer greater than or equal to 0, a quantity of i indicates an $i^{th}$ transmission, a value of $k_0(i)$ is one of $\{p_0, p_1, p_2, p_3\}$, wherein $p_{0=0}, p_1, p_2$, and $p_3$ are integers based on the size of the coded block $N_{CB}$, wherein $0<p_1<p_2 21$ $p_3 \le N_{CB}$, and $p_2-p_1<p_3-p_2$;

outputting, by the communication device, the output bit sequence, wherein the output bit sequence comprises a plurality of bits starting from the starting position $k_0(i)$ in the coded block, wherein the coded block is stored in a circular buffer;

generating, by the communication device, one or more modulation symbols based on the output bit sequence; and transmitting, by the communication device, the one or more modulation symbols.

2. The method according to claim 1, further comprising determining, by the communication device, a length of the output bit sequence that comprises the plurality of bits.

3. The method according to claim 1, wherein, during initial transmission, the output bit sequence includes information bits and parity bits that correspond to weight-2 columns.

4. The method according to claim 1, wherein the starting position $k_0(i)$ is determined based on a redundancy version number.

5. The method according to claim 4, wherein the redundancy version number is obtained through signaling.

6. The method according to claim 4, wherein the redundancy version number is obtained based on a sequence of redundancy version numbers and the quantity of i.

7. The method according to claim 6, wherein the sequence of the redundancy version numbers is read from a memory, or the sequence of the redundancy version numbers is determined based on an initial transmission code rate.

8. An apparatus, comprising:
at least one processor; and
a non-transitory computer-readable storage medium coupled to the at least one processor and storing programming instructions for execution by the at least one processor, the programming instructions instruct the at least one processor to:
obtain a starting position $k_0(i)$ of an output bit sequence in a coded block, wherein i is an integer greater than or equal to 0, a quantity of i indicates an $i^{th}$ transmission, a value of $k_0(i)$ is one of $\{p_0, p_1, p_2, p_3\}$, wherein $0 \leq p_0 < p_1 < p_2 < p_3 \leq N_{CB}$, $N_{CB}$ is a size of the coded block, and $p_2 - p_1 < p_3 - p_2$;
output the output bit sequence, wherein the output bit sequence comprises a plurality of bits starting from the starting position $k_0(i)$ in the coded block, wherein the coded block is stored in a circular buffer;
generate one or more modulation symbols based on the output bit sequence; and
transmit the one or more modulation symbols.

9. The apparatus according to claim 8, wherein the programming instructions further instruct the at least one processor to determine a length of the output bit sequence that comprises the plurality of bits.

10. The apparatus according to claim 8, wherein, during initial transmission, the output bit sequence includes information bits and parity bits that correspond to weight-2 columns.

11. The apparatus according to claim 8, wherein the starting position $k_0(i)$ is determined based on a redundancy version number.

12. The apparatus according to claim 11, wherein the redundancy version number is obtained through signaling.

13. The apparatus according to claim 11, wherein the redundancy version number is obtained based on a sequence of redundancy version numbers and the quantity of i.

14. The apparatus according to claim 13, wherein the sequence of the redundancy version numbers is read from a memory, or the sequence of the redundancy version numbers is determined based on an initial transmission code rate.

* * * * *